United States Patent
Van Den Nieuwenhuizen et al.

(10) Patent No.: US 9,473,095 B2
(45) Date of Patent: Oct. 18, 2016

(54) OUTPUT LEVEL ADJUSTMENT DEVICE

(71) Applicant: HIDDEN LLC, New York, NY (US)

(72) Inventors: John Van Den Nieuwenhuizen, San Francisco, CA (US); Vitor Alexandre Medeiros De Santa Maria, Milan (IT)

(73) Assignee: HIDDEN LLC, New York, NY (US)

( * ) Notice: Subject to any disclaimer, the term of this patent is extended or adjusted under 35 U.S.C. 154(b) by 4 days.

(21) Appl. No.: 14/405,104

(22) PCT Filed: Jun. 7, 2013

(86) PCT No.: PCT/US2013/044741
§ 371 (c)(1),
(2) Date: Dec. 2, 2014

(87) PCT Pub. No.: WO2013/185049
PCT Pub. Date: Dec. 12, 2013

(65) Prior Publication Data
US 2015/0125002 A1    May 7, 2015

Related U.S. Application Data

(60) Provisional application No. 61/657,410, filed on Jun. 8, 2012.

(51) Int. Cl.
*H03G 3/02* (2006.01)
*H01H 19/635* (2006.01)
(Continued)

(52) U.S. Cl.
CPC .............. *H03G 3/02* (2013.01); *H01H 19/025* (2013.01); *H01H 19/14* (2013.01); *H01H 19/635* (2013.01); *H01H 2219/039* (2013.01); *H01H 2221/01* (2013.01); *H01H 2221/014* (2013.01); *H01H 2221/024* (2013.01); *H01H 2239/048* (2013.01)

(58) Field of Classification Search
CPC ....................................................... H03G 3/02
USPC ........................................ 381/109, 322, 334
See application file for complete search history.

(56) References Cited

U.S. PATENT DOCUMENTS

| | | | | |
|---|---|---|---|---|
| 3,560,001 A | * | 2/1971 | Kelly | G11B 19/00 369/176 |
| 4,136,562 A | * | 1/1979 | Crooker | 73/187 |
| 5,070,539 A | * | 12/1991 | Cheng | 455/344 |

(Continued)

FOREIGN PATENT DOCUMENTS

| RU | 2160458 C2 | 12/2000 |
|---|---|---|
| WO | WO-2009-010399 A1 | 1/2009 |

OTHER PUBLICATIONS

International Search Report and Written Opinion (both in English) for PCT/US2013/044741, mailed Sep. 19, 2013; ISA/FIPS.

*Primary Examiner* — William Deane, Jr.
(74) *Attorney, Agent, or Firm* — Harness, Dickey & Pierce, P.L.C.

(57) ABSTRACT

A speaker assembly is provided and may include an outer portion having a plurality of slots. An inner portion may cooperate with the outer portion and may have a positioning lever and an adjustment mechanism slot. The positioning lever may cooperate with one of the plurality of slots. An adjustment mechanism may cooperate with one of the plurality of slots and the adjustment mechanism slot. The adjustment mechanism may slide within the adjustment mechanism slot changing a volume of the speaker assembly when the outer portion moves in relation to the inner portion.

18 Claims, 5 Drawing Sheets

(51) Int. Cl.
*H01H 19/02* (2006.01)
*H01H 19/14* (2006.01)

(56) References Cited

U.S. PATENT DOCUMENTS

| | | | |
|---|---|---|---|
| 7,218,746 B2 * | 5/2007 | Schmidt | H04R 1/028 381/334 |
| 7,814,583 B2 * | 10/2010 | Lerma | 4/541.1 |
| 8,284,972 B2 * | 10/2012 | Lin | 381/322 |
| 9,125,994 B2 * | 9/2015 | Plumptre | |
| 2007/0038148 A1 | 2/2007 | Mechelke et al. | |
| 2013/0327585 A1 * | 12/2013 | Murray | A47B 81/06 181/199 |
| 2015/0036858 A1 * | 2/2015 | Aboabdo | H04R 1/02 381/334 |

* cited by examiner

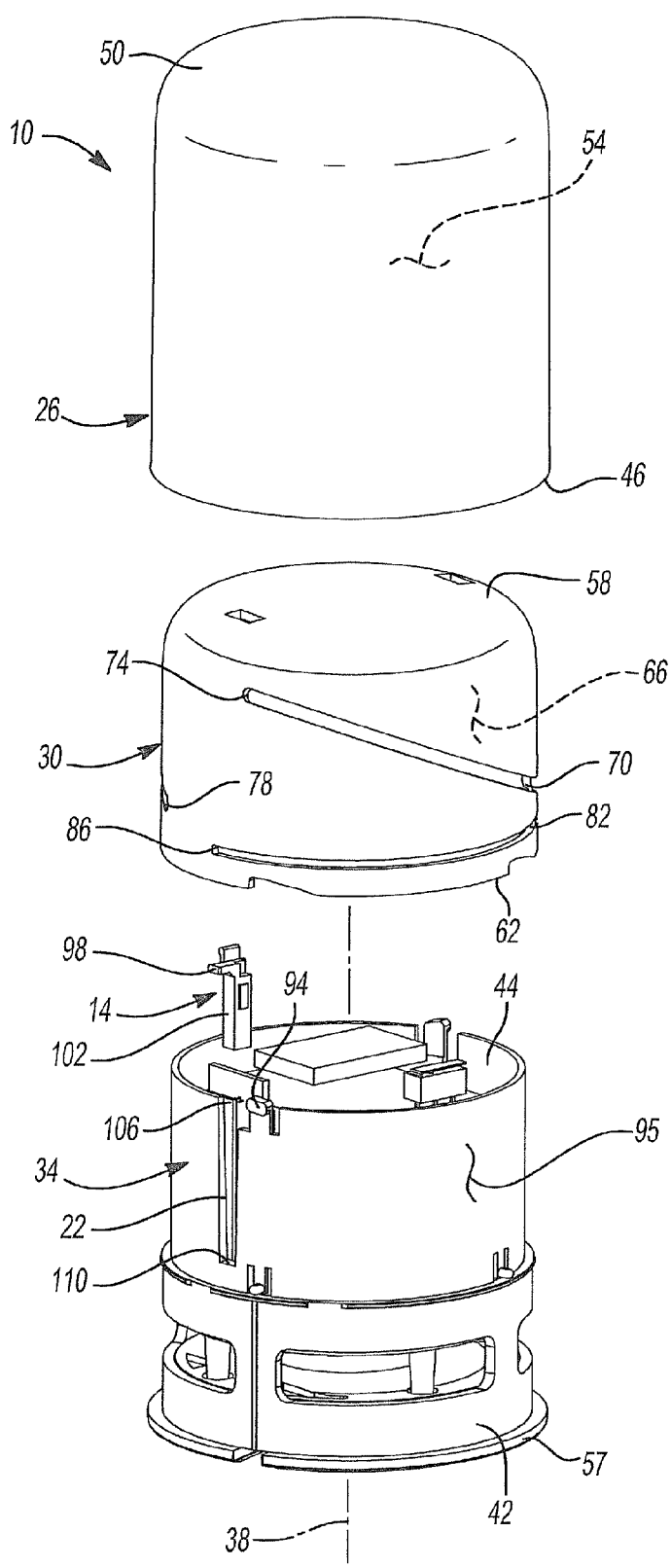

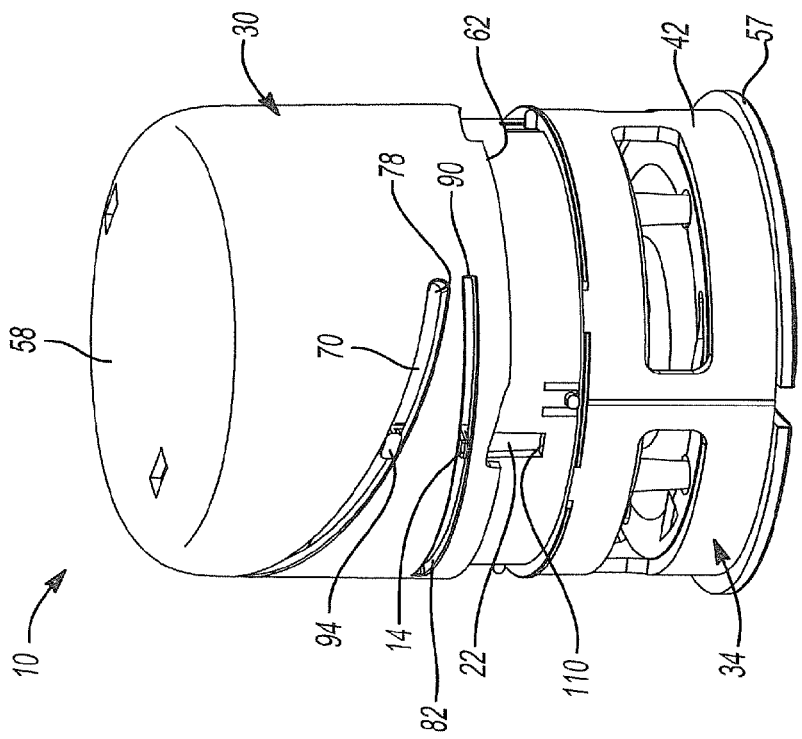
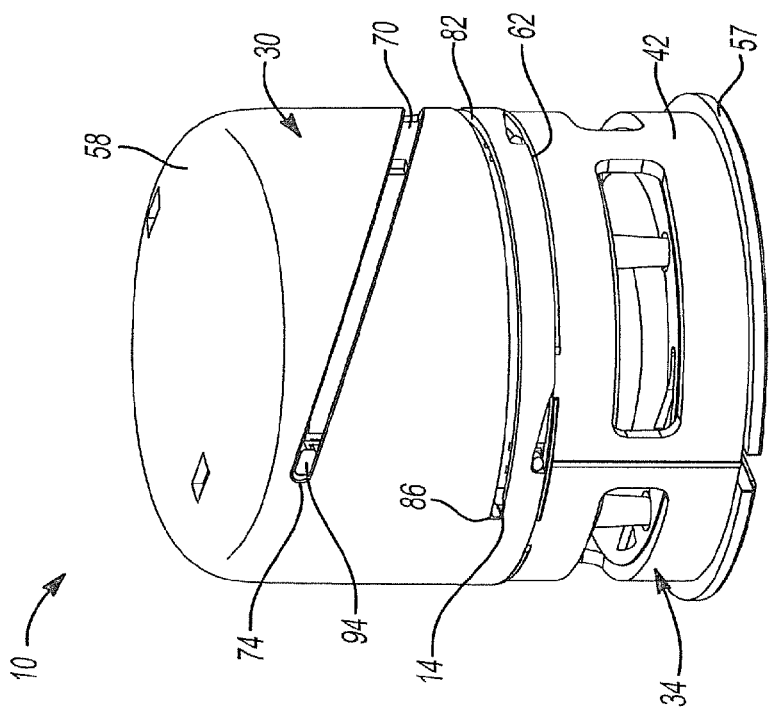

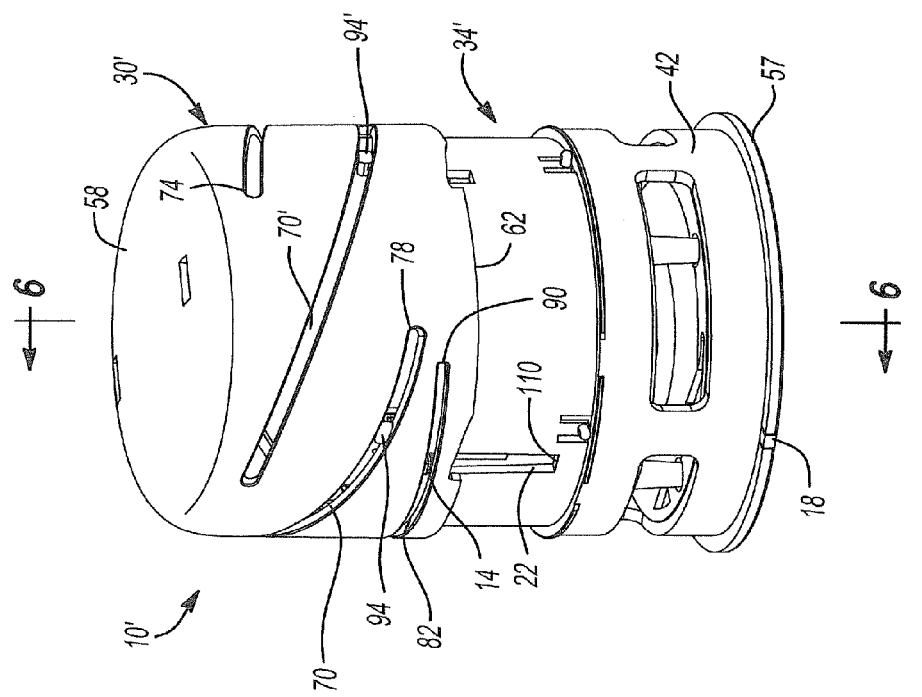
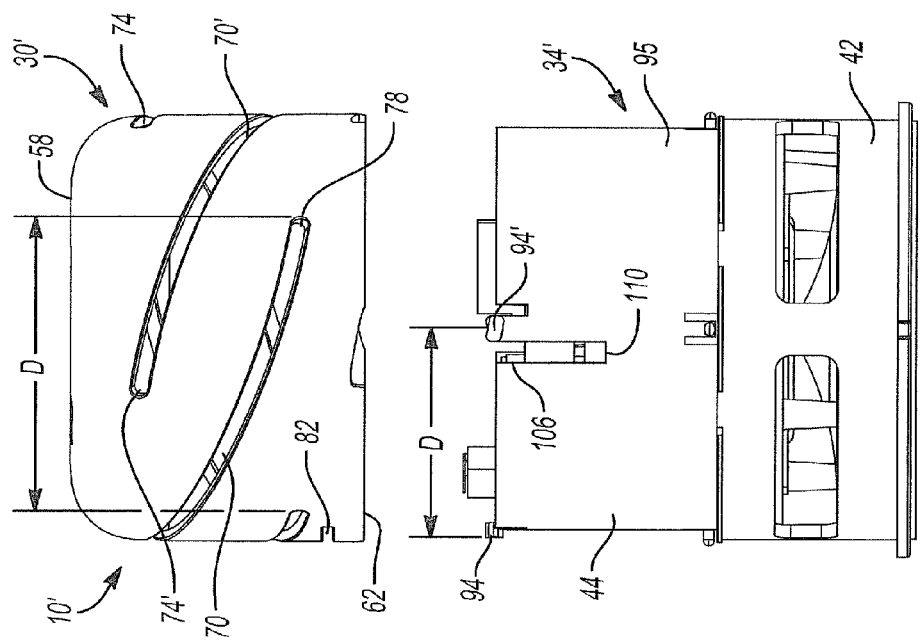

OUTPUT LEVEL ADJUSTMENT DEVICE

CROSS-REFERENCE TO RELATED APPLICATIONS

This application claims the benefit of U.S. Provisional Application No. 61/657,410, filed on Jun. 8, 2012. The entire disclosure of the above application is incorporated herein by reference.

FIELD

The present disclosure relates to an adjustment mechanism and more particularly to an output adjustment mechanism for an electric or electronic device.

BACKGROUND

This section provides background information related to the present disclosure which is not necessarily prior art.

A variety of portable electronic devices such as cellular telephones, digital music players, laptop computers, personal data assistants, etc. are available that are capable of playing audio files stored in the device. In particular, modern digital music players and cellular telephones are typically capable of storing and playing audio files. Unfortunately, the speakers on these devices are typically small due to the size and power constraints imposed on portable devices. These small speakers are incapable of producing the loud, high-quality audio that many consumers demand. As a result, consumers often couple such portable electronic devices to external speaker assemblies in an effort to increase the volume and/or quality of the sound produced by the portable electronic device.

Conventional speaker assemblies typically include an attenuation knob that controls volume through a potentiometer. The potentiometer increases or reduces the volume of sound coming from the speaker depending on the direction that the attenuation knob is turned.

While conventional knobs associated with speaker assemblies adequately control the volume of sound produced by the speaker assembly, knobs typically protrude from a surface of the speaker assembly and, as a result, are easily damaged. Further, such knobs often reduce the overall appearance and aesthetics of the speaker assembly.

SUMMARY

This section provides a general summary of the disclosure, and is not a comprehensive disclosure of its full scope or all of its features.

An apparatus for adjusting a control lever is provided. The apparatus may include an inner member, an adjustment mechanism, and an outer member. The inner member may include an adjustment mechanism slot and at least one positioning lever extending in a radial direction from a top end of the inner member. The adjustment mechanism may be slidably received by the adjustment mechanism slot. The outer member may be rotatably coupled to the inner member, and may include a slide portion and at least one diagonal slide portion. The slide portion may be slidably receive the adjustment mechanism. The at least one diagonal slide portion may slidably receive the at least one positioning lever.

In another configuration, an apparatus for adjusting a control lever is provided. The apparatus for adjusting a control lever may include an inner member and an outer member. The inner member has an outer diameter, and may include a positioning lever and an adjustment mechanism. The outer member has an inner diameter larger than the outer diameter of the inner member, and may rotatably receive the inner member. The outer member may be coupled to the adjustment mechanism and may slidably receive the positioning element when the outer member is rotated relative to the inner member.

In yet another configuration, a speaker assembly is provided and may include an outer portion having a plurality of slots. An inner portion may cooperate with the outer portion and may have a positioning lever and an adjustment mechanism slot. The positioning lever may cooperate with one of the plurality of slots. An adjustment mechanism may cooperate with one of the plurality of slots and the adjustment mechanism slot. The adjustment mechanism may slide within the adjustment mechanism slot changing a volume of the speaker assembly when the outer portion moves in relation to the inner portion.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 is an exploded view of a speaker assembly in accordance with the present disclosure;

FIG. 2 is a perspective view of the speaker assembly of FIG. 1 with a top cap removed to show internal components of an adjustment mechanism in an OFF state;

FIG. 3 is a perspective view of the speaker assembly of FIG. 1 with a top cap removed to show internal components of an adjustment mechanism in a 50% volume ON state;

FIG. 7 is an exploded view of an alternative configuration of the speaker assembly of FIG. 1; and FIG. 8 is a perspective view of the speaker assembly of FIG. 7 with the top cap removed to show internal components of an adjustment mechanism in a 50% volume ON state.

Corresponding reference numerals indicate corresponding parts throughout the several views of the drawings.

DETAILED DESCRIPTION

Figure 5:
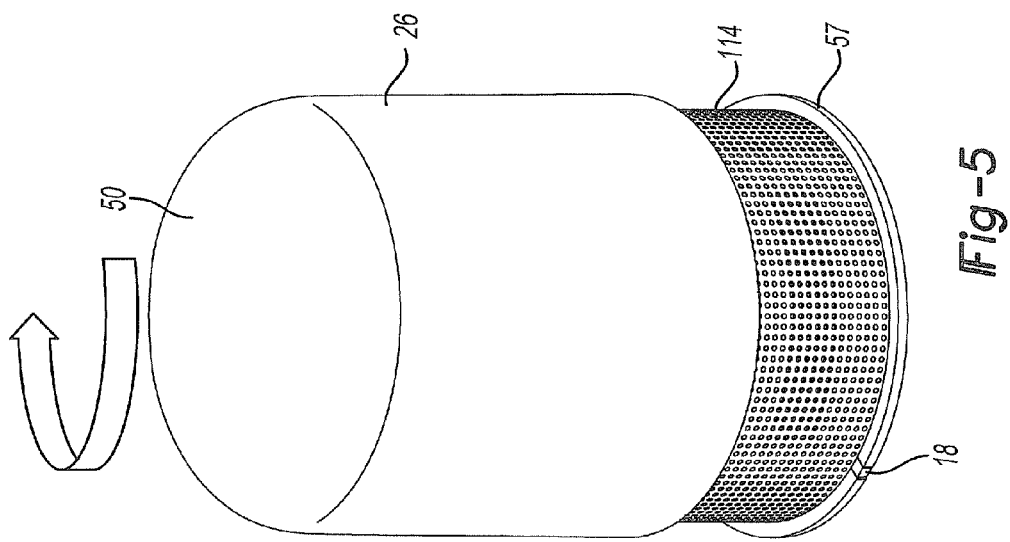
FIG. 5 is a perspective view of the speaker assembly of FIG. 1 showing movement of the speaker assembly from an OFF state to an ON state.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

With reference to the figures, a speaker assembly 10 is provided and may include an adjustment mechanism 14 for adjusting a volume and/or an indicator light 18 (FIG. 5). Specifically, the adjustment mechanism 14 raises and lowers in an adjustment mechanism slot 22 to increase or decrease the volume and simultaneously increase or decrease the intensity of the indicator light 18. While the speaker assembly 10 is described herein as including a speaker and/or an indicator light, it will be appreciated that the speaker assembly 10 may include more than one speaker and/or more than one indicator light.

With particular reference to FIG. 1, the speaker assembly 10 may include a top cap 26, an outer portion 30, and an inner portion 34. The outer portion 30 may be in cooperation with the inner portion 34 to control the adjustment mechanism 14. The outer portion 30 may rotate around an axis 38 normal to a plane created by a generally circular bottom end 42 and top end 44 of the inner portion 34. The outer portion 30 may rotate in a first direction to increase the speaker volume and/or indicator light intensity and a second direction to decrease the speaker volume and/or indicator light intensity. The outer portion 30 may be attached to the top cap 26 to fix the outer potion 30 for movement with the top cap 26. For example, the outer portion 30 may be attached to the top cap 26 via a press fit and/or an adhesive to allow the top cap 26 and the outer portion 30 to rotate as a single element.

Figure 6:
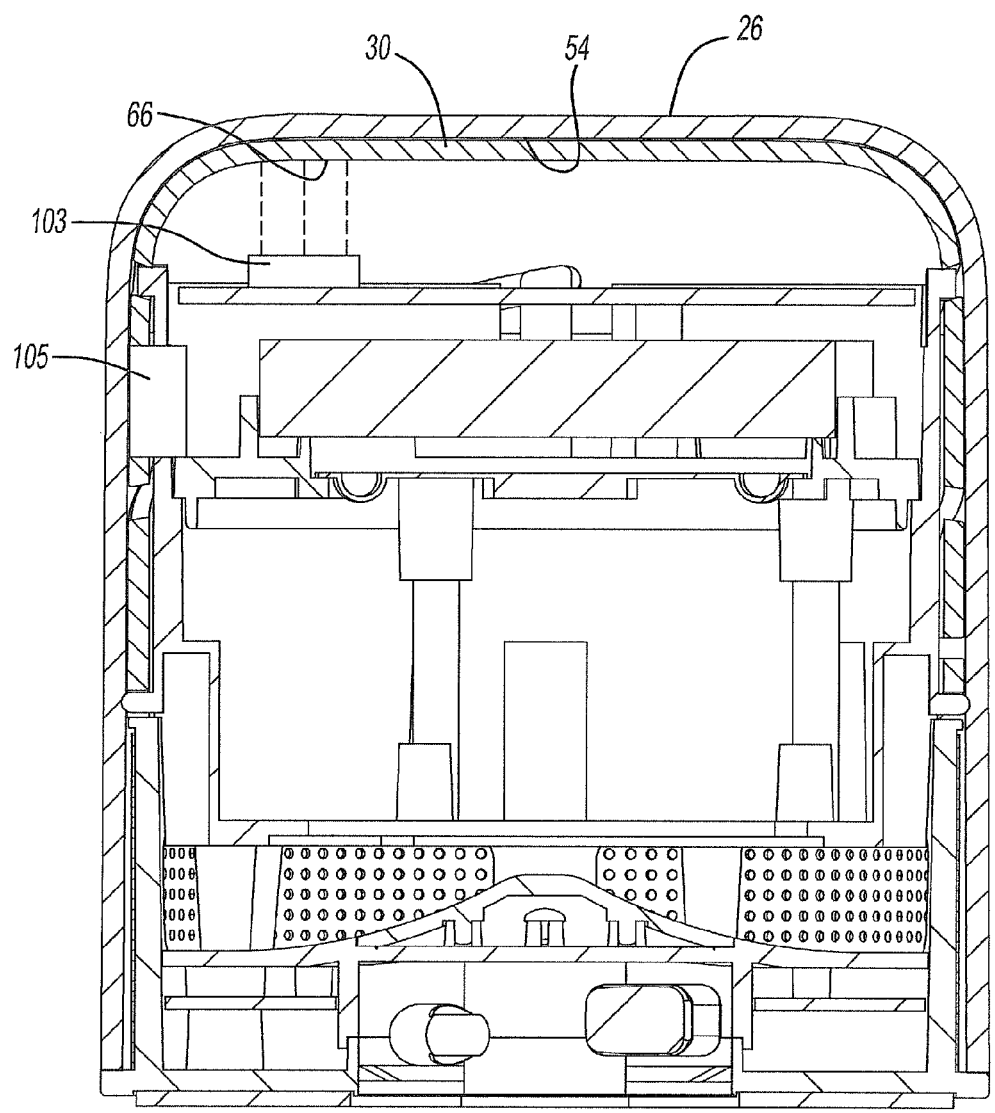
FIG. 6 is a cross-sectional view of the speaker assembly of FIG. 1.

The top cap 26 may include a generally tubular or cylindrical shape with an open end 46 and a capped end 50. The capped end 50 may be of a rounded dome shape. With reference to FIG. 6, an inner surface 54 of the top cap 26 may have a diameter equal to or slightly larger than a diameter of the outer portion 30 such that the inner surface 54 fits over the outer portion 30. The top cap 26 protects the speaker assembly from dust and elements that might damage the speaker. In an OFF state, the top cap 26 may fully cover the outer portion 30 and the inner portion 34 such that only a base portion 57 of the inner portion 34 is visible.

The outer portion 30 includes a top end 58 and a bottom end 62. The outer portion 30 may be of a generally tubular or cylindrical shape and may fit within the top cap 26. With reference to FIG. 6, an inner surface 66 of the outer portion 30 may have a diameter slightly larger than a diameter of the inner portion 34 such that the outer portion 30 fits over the inner portion 34.

The outer portion 30 further includes a plurality of slots for adjusting the speaker volume and indicator light intensity. Namely, a diagonal slot 70 may be located in the outer portion 30 in a position such that a first end 74 of the diagonal slot is near the top end 58 of the outer portion 30, and a second end 78 of the diagonal slot is near the bottom end 62 of the outer portion 30. The diagonal slot 70 may control the position of the outer portion 30 relative to the inner portion 34 as the outer portion 30 is rotated to increase and decrease the speaker volume and/or indicator light intensity.

With reference to FIGS. 7 and 8, an alternative configuration of the speaker assembly 10' is provided and may include an outer portion 30' having a second diagonal slot 70' in addition to the diagonal slot 70. The speaker assembly 10' is generally similar to the speaker assembly 10. Accordingly, like reference numerals are used hereinafter and in the drawings to identify like components while like reference numerals containing an apostrophe (') are used to identify those components that have been modified.

The second diagonal slot 70' may extend parallel to, and otherwise be substantially the same as, the diagonal slot 70. As will be described below, the second diagonal slot 70' may cooperate with the diagonal slot 70 to provide axial support for the outer portion 30' relative to an inner portion 34'.

References herein to the diagonal slot 70 will be understood by those skilled in the art to apply equally to the second diagonal slot 70'.

A horizontal slot 82 having a first end 86 and a second end 90 may be located near the bottom end 62 of the outer portion 30. The horizontal slot 82 holds the adjustment mechanism 14 in the same vertical position relative to the outer portion 30 as the top cap 26 and outer portion 30 rotate to increase or decrease the volume and indicator light intensity. The horizontal slot 82 allows the adjustment mechanism 14 to slide within the adjustment mechanism slot 22 as the horizontal slot 82 and top cap 26 are rotated.

While the top cap 26 and outer portion 30 are described and shown as being separate components, the diagonal slot 70 and horizontal slot 82 could alternatively be formed as grooves in the inner surface of the top cap 26, thereby eliminating the need for a separate top cap 26 and outer portion 30.

The inner portion 34 includes the bottom end 42 and the top end 44 and may be of a generally tubular or cylindrical shape. The diameter of the inner portion 34 may be slightly less than the diameter of the inner surface 66 of the outer portion 30 such that the outer portion 30 fits over the inner portion 34 and can freely rotate around and relative to the inner portion 34.

Figure 4:
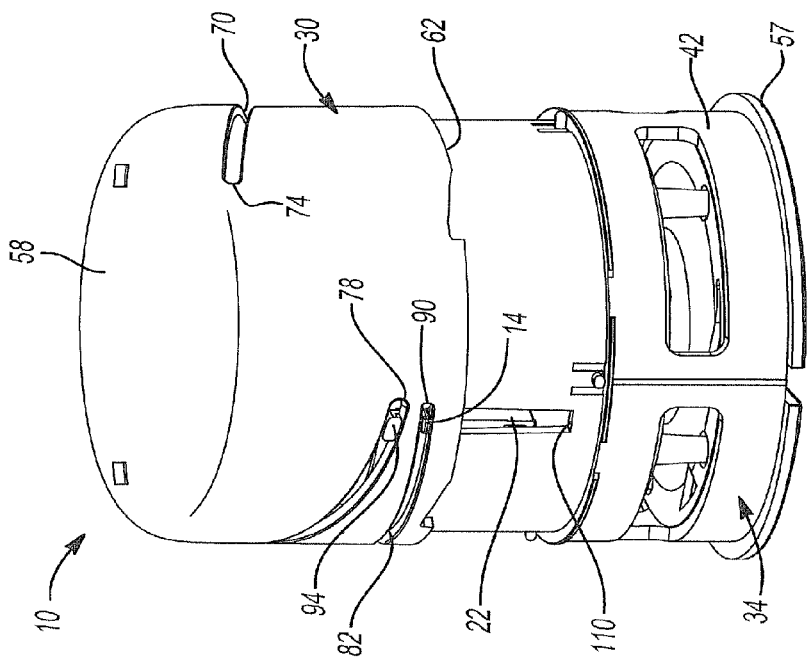
FIG. 4 is a perspective view of the speaker assembly of FIG. 1 with a top cap removed to show internal components of an adjustment mechanism in a 100% volume ON state.

The inner portion 34 further includes the adjustment mechanism 14, the adjustment mechanism slot 22, and a positioning lever 94 (shown in FIGS. 2-4). The adjustment mechanism 14 may include a lever portion 98 and a support portion 102. With reference to FIG. 6, the adjustment mechanism 14 may include a proximity sensor 103, a motion sensor 105, a short range camera, an infrared sensor, or other similar sensing device that is capable of sensing motion and/or proximity and capable of adjusting an output of the speaker assembly 10 and/or the indicator light 18 based on the position of the top cap 26 and outer portion 30 relative to the inner portion 34. Specifically, the potentiometer or infrared sensor may be located within the inner portion 34 and may control an output of the speaker assembly 10 based on the relative position of the lever portion 98 within the slot 22.

The adjustment mechanism 14 is slideably received within the adjustment mechanism slot 22 to allow the adjustment mechanism 14 to freely move in a vertical manner as the positioning lever 94 traverses the diagonal slot 70. The adjustment mechanism slot 22 may be a vertical slot, substantially parallel to axis 38, formed in the inner portion 34 and may include a top end 106 and a bottom end 110 (FIG. 1). Further, the adjustment mechanism slot 22 may extend from a position between the top end 44 and the bottom end 42 of the inner portion 34.

In operation, as the position of the adjustment mechanism 14 moves toward the top end 106 of the adjustment mechanism slot 22, the speaker volume may increase and/or the indicator light intensity may simultaneously increase. As the position of the adjustment mechanism 14 moves toward the bottom end 110 of the adjustment mechanism slot 22, the speaker volume may decrease and/or the indicator light intensity may decrease simultaneously.

The positioning lever 94 may be fixed in a radial direction at the top end 44 of the inner portion 34 and may extend from an outer surface 95 of the inner portion 34. The positioning lever 94 may be slideably received within the diagonal slot 70 such that it freely slides within the slot 70 to permit movement of the outer portion 30 relative to the positioning lever 94. The location of the positioning lever 94 within the diagonal slot 70 determines the position of the outer portion 30 and top cap 26 relative to the inner portion 34.

The position of the positioning lever 94 within the diagonal slot 70 also determines the position of the adjustment mechanism 14 relative to the inner portion 34 within the adjustment mechanism slot 22 and the position of the adjustment mechanism 14 relative to the inner portion 34 within the horizontal slot 82. Specifically, as the outer portion 30 is rotated relative to the inner portion 34, the outer portion 30 and the adjustment mechanism 14 will slide in the adjustment mechanism slot 22 relative to the inner portion, in a direction substantially parallel to the axis 38. Accordingly, the length of the diagonal slot 70 and the angle of the diagonal slot 70 determines the position of the outer portion 30 relative to the inner portion 34 as the outer portion 30 rotates.

With particular reference to FIG. 4, in one configuration, the distance between the first end 74 and the second end 78 of the diagonal slot 70 may substantially traverse the circumference of the outer portion 30. The position of the adjustment mechanism 14 relative to the inner portion 34 within the adjustment mechanism slot 22 determines the corresponding volume and/or indicator light intensity.

With reference to FIGS. 7 and 8, in the alternative configuration of the speaker assembly 10', the inner portion 34' may include a second positioning lever 94' in addition to the positioning lever 94. The second positioning lever 94' may be substantially the same as the positioning lever 94, with the exception that the second positioning lever 94' may be offset from the positioning lever 94 by the distance D relative to the circumference of the cover portion 30'. The positioning lever 94 and the second positioning lever 94' may cooperate with the diagonal slot 70 and second diagonal slot 70' to provide axial support for the outer portion 30' relative to the inner portion 34'. Further, the positioning levers 94, 94' may control different features. For example, the positioning lever 94 may control a volume while the positioning lever 94' controls intensity of light 18. While the speaker assembly 10' is shown as including a pair of diagonal slots 70, 70', the speaker assembly 10' could include a third diagonal slot and associated positioning lever (neither shown), for a total of three diagonal slots and one horizontal slot 82.

The inner portion 34 may also house a plurality of electrical components of the speaker assembly 10 and/or indicator light 18 including components such as wiring, an amplifier, diaphragm, coil, batteries, etc. The inner portion may also include a covering 114 (shown in FIG. 5) located generally in the bottom half of the inner portion 34 that shields and protects the electrical components. The covering may be mesh, or a similar material that allows sound to pass through without dampening.

The base 57 may be located on the bottom end 42 of the inner portion 34 and may have a diameter equal to the diameter of the top cap 26 such that when the top cap is in a fully closed position, the top cap 26 and the base 57 meet to form a substantially smooth and uniform outer surface.

FIG. 2 illustrates the speaker assembly in an OFF state with the top cap 26 removed to show internal components of the adjustment mechanism 14. In the OFF state, the positioning lever 94 is in a position adjacent to the first end 74 of the diagonal slot 70. The adjustment mechanism 14 is in a position adjacent to the first end 86 of the horizontal slot 82, and the adjustment mechanism 14 is in a position adjacent to the bottom end 110 of the adjustment mechanism slot 22. In the OFF state, the volume and indicator light intensity will be zero, and there may be no power supplied to the speaker assembly 10 from a power source (not shown).

As the top cap 26 is turned in a counterclockwise direction, as shown in FIG. 5, the speaker assembly 10 may be turned on and power may be supplied to the speaker assembly 10. By continuing to turn the top cap 26 in the counterclockwise direction, the volume will increase and/or the indicator light intensity will increase. It is also foreseen that the same could occur when the top cap 26 is turned in a clockwise direction.

FIG. 3 illustrates the speaker assembly in an approximate 50% volume state. The top cap is removed in this illustration to show the internal components of the speaker assembly 10. The top cap 26 and the outer portion 30 may be generally halfway unscrewed relative to the inner portion 34. The positioning lever 94 is in a position generally halfway between the first end 74 and the second end 78 of the diagonal slot 70. The adjustment mechanism 14 is in a generally central position between the first and second ends 86, 90 of the horizontal slot 82, and the adjustment mechanism 14 is in a generally central position between the top end 106 and the bottom end 110 of the adjustment mechanism slot 22. At the 50% volume state, the volume and indicator light intensity are at approximately 50% of the volume and intensity maximum output.

FIG. 4 illustrates the speaker assembly in a 100% volume state. The top cap 26 is removed in this illustration to show the internal components of the speaker assembly 10. The top cap 26 and the outer portion 30 are fully unscrewed relative to the inner portion 34 and the bottom end 62 of the outer portion 30 will be a maximum distance from the base 57. The positioning lever 94 is in a position adjacent to the second end 78 of the diagonal slot 70. The adjustment mechanism 14 is in a position adjacent to the second end 90 of the horizontal slot 82, and the adjustment mechanism 14 is in a position adjacent to the top end 106 of the adjustment mechanism slot 22. At the 100% volume state, the volume of the speaker assembly 10 may be at the maximum volume and/or the intensity of the indicator light 18 may be at the maximum intensity output. The maximum volume output may be approximately 80 decibels (dB).

FIG. 5 illustrates the speaker assembly 10 at the 100% volume state with the top cap 26 assembled. When assembled, only the top cap 26, the covering 96, the base 57, and the indicator light 18 may be visible. The indicator light 18 may indicate the volume level by its intensity. When the indicator light 18 is off the volume is similarly off. When the indicator light 18 is dim, the volume is low. When the indicator light 18 brightens as the top cap 26 is turned in a counterclockwise direction, the volume increases. It is also contemplated that the indicator light 18 may operate independently of the speaker assembly 10, such that the intensity of the indicator light 18 does not change when the volume changes.

The speaker assembly 10 may communicate with other wireless devices such as cellular telephones, laptop computers, etc., through Bluetooth or Wi/Fi communication. The speaker assembly 10 may also communicate with other wireless devices through wired communication (for example only an auxiliary cable, etc.) or any other reasonable communication method (for example only, Near Field Communication, etc.). As the speaker assembly 10 is turned on but the volume is still off or inaudible, the indicator light 18 may be a red light, and, as the volume is increased, the indicator light 18 may be a green light that intensifies with increased volume. The speaker assembly 10 may additionally include an AM/FM radio.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An apparatus for adjusting a control lever comprising:
    an inner member having an adjustment mechanism slot and at least one positioning lever extending in a radial direction from a top end of said inner member;
    an adjustment mechanism slidably received by said adjustment mechanism slot;
    an outer member rotatably coupled to said inner member, said outer member including a slide portion and at least one diagonal slide portion, wherein said slide portion is operable to slidably receive said adjustment mechanism, and said at least one diagonal slide portion is operable to slidably receive said at least one positioning lever; and
    a speaker mounted between said inner member and said outer member, wherein the adjustment mechanism is operable to adjust output of said speaker.

2. The apparatus of claim 1, wherein said adjustment mechanism slot extends substantially parallel to a rotational axis of said outer member.

3. The apparatus of claim 1, wherein said slide portion is a horizontal slot extending substantially perpendicular to a rotational axis of said outer member.

4. The apparatus of claim 1, wherein said at least one diagonal slide portion is a first diagonal slot extending circumferentially from a bottom end of said outer member to a top end of said outer member.

5. The apparatus of claim 4, further comprising a second diagonal slot extending circumferentially from the bottom end of said outer member to the top end of said outer member, wherein said second diagonal slot is parallel to said first diagonal slot.

6. The apparatus of claim 1, wherein said at least one diagonal slide portion is operable to control the position of the outer member relative to the inner member when the outer member is rotated relative to the inner member.

7. The apparatus of claim 1, wherein said slide portion is operable to slidably receive the adjustment mechanism when the outer member is rotated relative to the inner member.

8. The apparatus of claim 1, further comprising a light source mounted between said inner member and said outer member, wherein the adjustment mechanism is operable to adjust the output of said light source.

9. The apparatus of claim 1, wherein at least one of the slide portion and the at least one diagonal slide portion is a groove in an inner wall of said outer member.

10. The apparatus of claim 1, wherein at least one of the slide portion and the at least one diagonal slide portion is a flange adjacent to an inner wall of said outer member.

11. The apparatus of claim 1, wherein said inner member and said outer member are cylindrical in shape.

12. The apparatus of claim 1, further comprising a top cap member coupled to said outer member.

13. The apparatus of claim 11, wherein said inner member includes a flanged portion and an end of said top cap member is adjacent said flanged portion when the apparatus is in a first configuration.

14. The apparatus of claim 11, wherein said top cap is a generally cylindrical shape having an inner portion, and wherein said top cap is operable to cover the inner member and the outer member.

15. An apparatus for adjusting a control lever comprising:
- an inner member having an adjustment mechanism slot and at least one positioning lever extending in a radial direction from a top end of said inner member;
- at least one of a proximity sensor, a motion sensor, and a short-range camera sensor included with the inner member;
- an outer member rotatably coupled to said inner member, said outer member including at least one diagonal slide portion, wherein said at least one diagonal slide portion is operable to slidably receive said at least one positioning lever, and at least one of said proximity sensor, said motion sensor, and said short-range camera sensor is operable to sense a position of said outer member relative to said inner member; and
- a speaker mounted between said inner member and said outer member, wherein the adjustment mechanism is operable to adjust output of said speaker.

16. An apparatus for adjusting a control lever comprising:
- an inner member having an outer diameter and a longitudinal axis, said inner member including an adjustment mechanism;
- an outer member having an inner diameter larger than said outer diameter, wherein said outer member is operable to receive said inner member, and further operable to vary a location of said adjustment mechanism when the outer member is moved relative to the inner member in a direction substantially parallel to said longitudinal axis; and
- a speaker mounted between said inner member and said outer member, wherein the adjustment mechanism is operable to adjust the output of said speaker, wherein said adjustment mechanism extends in a direction substantially parallel to a rotational axis of said outer member upon rotation of said outer member.

17. The apparatus of claim 16, wherein the adjustment mechanism is operable to adjust a sound produced by said speaker.

18. A speaker assembly comprising:
- an outer portion having a plurality of slots;
- an inner portion cooperating with the outer portion and having a positioning lever and an adjustment mechanism slot, wherein the positioning lever is received by one of the plurality of slots;
- an adjustment mechanism received by one of the plurality of slots and the adjustment mechanism slot, wherein the adjustment mechanism slides within the adjustment mechanism slot changing a volume of the speaker assembly when the outer portion moves in relation to the inner portion; and
- a speaker mounted between said inner portion and said outer portion, wherein the adjustment mechanism is operable to adjust output of said speaker, wherein said adjustment mechanism extends in a direction substantially parallel to a rotational axis of said outer member upon rotation of said outer member.

* * * * *